(12) United States Patent
König et al.

(10) Patent No.: US 10,141,459 B2
(45) Date of Patent: Nov. 27, 2018

(54) BINARY GLASS FRITS USED IN N-TYPE SOLAR CELL PRODUCTION

(71) Applicant: Heraeus Deutschland GmbH & Co. KG, Hanau (DE)

(72) Inventors: Markus König, Dieburg (DE); Matthias Hörteis, Hanau (DE); Weiming Zhang, Blue Bell, PA (US)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 155 days.

(21) Appl. No.: 14/655,301

(22) PCT Filed: Dec. 23, 2013

(86) PCT No.: PCT/EP2013/003909
§ 371 (c)(1),
(2) Date: Jun. 24, 2015

(87) PCT Pub. No.: WO2014/102003
PCT Pub. Date: Jul. 3, 2014

(65) Prior Publication Data
US 2015/0357489 A1 Dec. 10, 2015

Related U.S. Application Data

(60) Provisional application No. 61/746,961, filed on Dec. 28, 2012.

(30) Foreign Application Priority Data

Dec. 28, 2012 (EP) ..................................... 12008650

(51) Int. Cl.
*H01L 31/0224* (2006.01)
*H01L 31/18* (2006.01)
(Continued)

(52) U.S. Cl.
CPC ........ *H01L 31/022425* (2013.01); *C03C 8/18* (2013.01); *C03C 8/22* (2013.01);
(Continued)

(58) Field of Classification Search
None
See application file for complete search history.

(56) References Cited

U.S. PATENT DOCUMENTS

| 4,256,513 A | 3/1981 | Yoshida et al. |
| 5,714,246 A | 2/1998 | Shaikh et al. |

(Continued)

FOREIGN PATENT DOCUMENTS

| EP | 1713094 A2 | 10/2006 |
| EP | 1 713 093 B1 | 9/2008 |

(Continued)

OTHER PUBLICATIONS

Seyedmohammadi, et al., Screen Printable Ag-Al Metal Pastes for P* Silicon Application in Solar Cells, 2010, pp. 3600-3603.
(Continued)

*Primary Examiner* — Eli S Mekhlin
(74) *Attorney, Agent, or Firm* — Blank Rome LLP

(57) ABSTRACT

In general, the invention relates to electro-conductive pastes containing binary glass frits and photovoltaic solar cells, preferably n-type photovoltaic solar cells. More specifically, the invention relates to solar cell precursors, processes for preparation of solar cells, solar cells and solar modules.
The invention relates to a solar cell precursor comprising as precursor parts
  i. a wafer with a back face and a front face, wherein the front face comprises a p-doped layer
  ii. a first paste comprising
    Ag particles;
    Al particles in a range from about 0.01 to about 5 wt. %, based on the total weight of the paste;
(Continued)

a vehicle;

a glass frit in a range from about 0.1 to about 5 wt. %, based on the total weight of the paste, wherein the glass frit comprises a first glass frit with a glass transition temperature $T_{gI}$ and a further glass frit with a glass transition temperature $T_{gf}$, wherein $T_{gf}$ differs from $T_{gI}$ by at least about 10° C.;

an additive;

superimposed on a first area on said p-doped layer.

29 Claims, 6 Drawing Sheets

(51) Int. Cl.
    *C03C 8/18*     (2006.01)
    *C03C 8/22*     (2006.01)
    *H01B 1/16*     (2006.01)

(52) U.S. Cl.
    CPC ............... *H01B 1/16* (2013.01); *H01L 31/18* (2013.01); *Y02E 10/50* (2013.01)

(56) References Cited

U.S. PATENT DOCUMENTS

| | | | | |
|---|---|---|---|---|
| 2005/0178431 A1* | 8/2005 | Yang | ............... | H01L 31/068 136/259 |
| 2007/0158621 A1* | 7/2007 | Sakamoto | ............... | H01B 1/22 252/500 |
| 2009/0266409 A1* | 10/2009 | Wang | ............... | H01B 1/16 136/252 |
| 2009/0318596 A1* | 12/2009 | Fu | ............... | C08G 18/0823 524/232 |
| 2010/0096014 A1 | 4/2010 | Iida et al. | | |
| 2010/0126565 A1 | 5/2010 | Takeda et al. | | |
| 2010/0229925 A1* | 9/2010 | Kim | ............... | H01L 31/022425 136/252 |
| 2010/0269893 A1 | 10/2010 | Prince et al. | | |
| 2011/0000531 A1 | 1/2011 | Kwag et al. | | |
| 2011/0180139 A1* | 7/2011 | Adachi | ............... | H01B 1/22 136/256 |
| 2011/0197963 A1 | 8/2011 | Akimoto | | |
| 2011/0214718 A1* | 9/2011 | Hayashi | ............... | B05D 5/12 136/252 |
| 2012/0031484 A1* | 2/2012 | Matsuno | ............... | C03C 3/072 136/256 |
| 2012/0152343 A1* | 6/2012 | Cheng | ............... | H01B 1/22 136/256 |
| 2012/0171810 A1* | 7/2012 | Park | ............... | C03C 8/18 438/98 |
| 2012/0255605 A1* | 10/2012 | Takeda | ............... | H01B 1/22 136/256 |

FOREIGN PATENT DOCUMENTS

| | | |
|---|---|---|
| EP | 2472526 A2 | 7/2012 |
| JP | 8148447 | 7/1996 |
| JP | 2004179333 A | 6/2004 |
| JP | 2010062319 A | 3/2010 |
| JP | 2011171673 A | 9/2011 |
| JP | 2011204872 A | 10/2011 |
| TW | 200947717 A | 11/2009 |
| WO | WO-2010016186 A1 | 2/2010 |
| WO | WO-2010117773 A1 | 10/2010 |
| WO | WO-2012019065 A2 | 2/2012 |

OTHER PUBLICATIONS

International Search Report issued in PCT/EP2013/003909 dated Feb. 13, 2014.

* cited by examiner

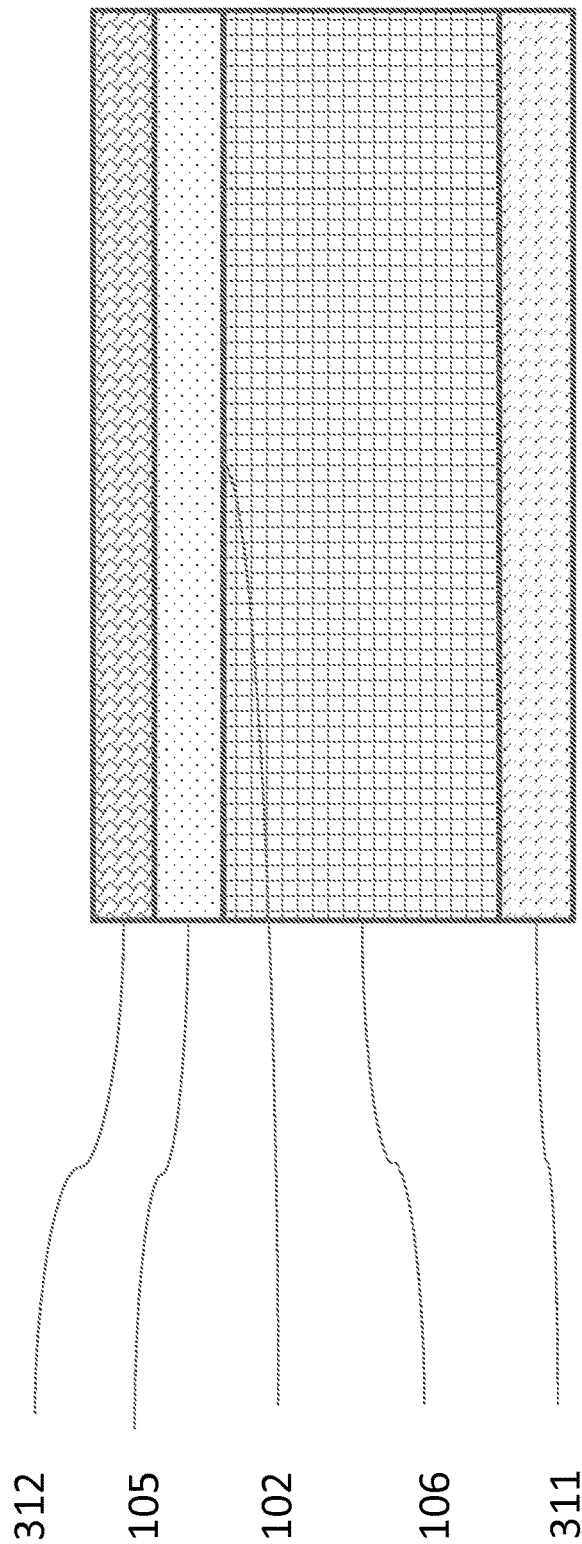

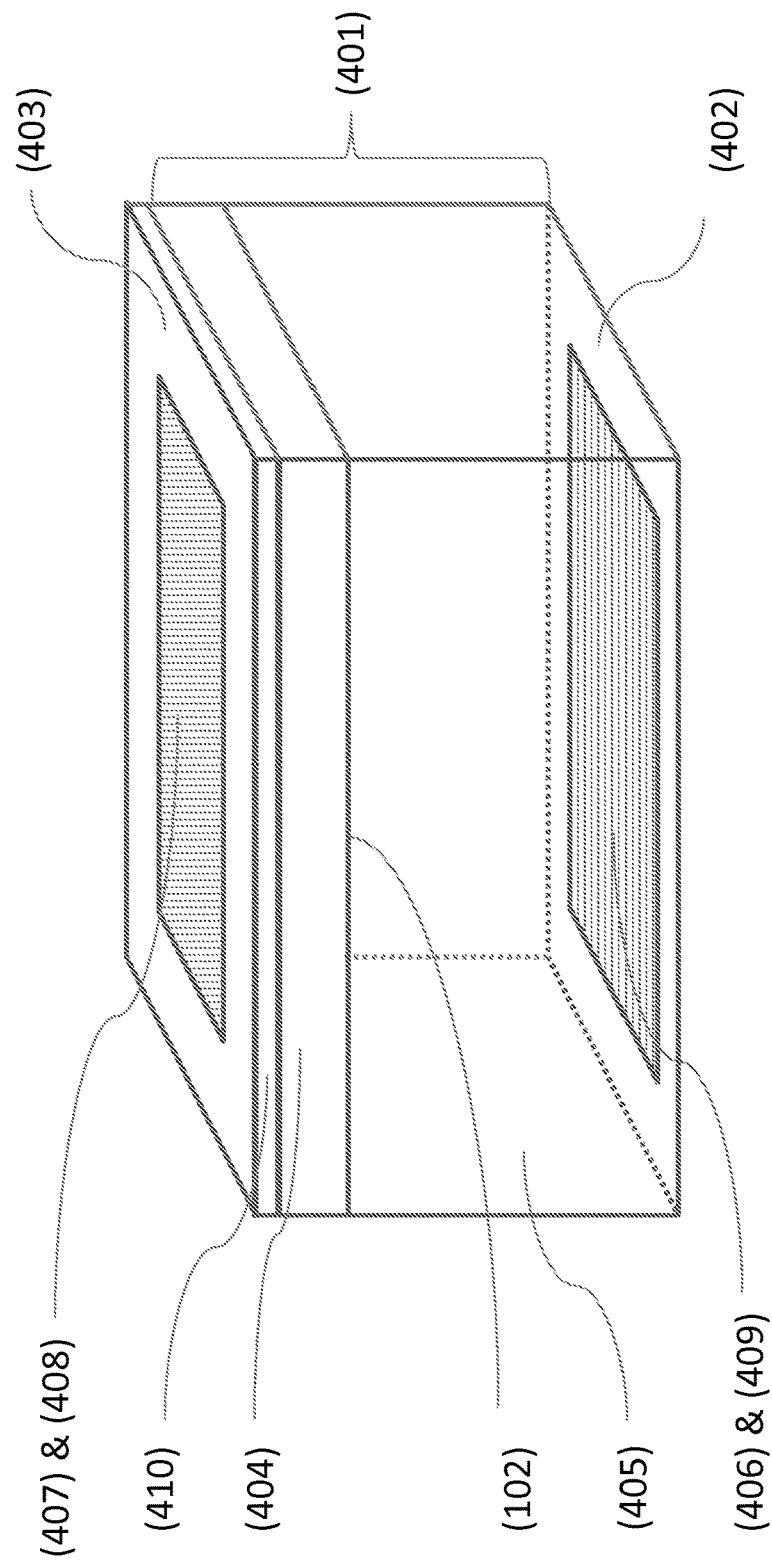

BINARY GLASS FRITS USED IN N-TYPE SOLAR CELL PRODUCTION

This application is a national stage of International Patent Application No. PCT/EP2013/003909, filed Dec. 23, 2013, which claims the benefit of European Patent Application 12008650.9, filed Dec. 28, 2012, and U.S. Provisional Patent Application No. 61/746,961, filed Dec. 28, 2012, which are hereby incorporated by reference.

FIELD OF THE INVENTION

In general, the invention relates to electro-conductive pastes containing binary glass frits and photovoltaic solar cells, preferably n-type photovoltaic solar cells. More specifically, the invention relates to solar cell precursors, processes for preparation of solar cells, solar cells and solar modules.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted photons are absorbed by the solar cell, which is usually made of a semiconducting material, such as silicon which is often doped appropriately. The absorbed photon energy excites electrons of the semiconducting material, generating electron-hole pairs. These electron-hole pairs are then separated by p-n junctions and collected by conductive electrodes on the solar cell surfaces. FIG. 1 shows a minimal construction for a simple solar cell.

Solar cells are very commonly based on silicon, often in the form of a Si wafer. Here, a p-n junction is commonly prepared either by providing an n-type doped Si substrate and applying a p-type doped layer to one face or by providing a p-type doped Si substrate and applying an n-type doped layer to one face to give in both cases a so called p-n junction. The face with the applied layer of dopant generally acts as the front face of the cell, the opposite side of the Si with the original dopant acting as the back face. Both n-type and p-type solar cells are possible and have been exploited industrially. Cells designed to harness light incident on both faces are also possible, but their use has been less extensively harnessed.

In order to allow incident light on the front face of the solar cell to enter and be absorbed, the front electrode is commonly arranged in two sets of perpendicular lines known as "fingers" and "bus bars" respectively. The fingers form an electrical contact with the front face and bus bars link these fingers to allow charge to be drawn off effectively to the external circuit. It is common for this arrangement of fingers and bus bars to be applied in the form of an electro-conductive paste which is fired to give solid electrode bodies. A back electrode is also often applied in the form of an electro-conductive paste which is then fired to give a solid electrode body. A typical electro-conductive paste contains metallic particles, glass frit, and an organic vehicle.

There has recently been increasing interest in n-type solar cells, wherein the front face is p-type doped. n-type solar cells have the potential for increased cell performance with respect to the analogous p-type cells, but disadvantages remain due to damage to the cell during firing resulting in a lowered efficiency.

There have been some attempts in the prior art to improve the properties of solar cells. One such attempt is described in EP2472526A2.

There is thus a need in the state of the art for improvements to the approach to producing n-type solar cells.

SUMMARY OF THE INVENTION

The invention is generally based on the object of overcoming at least one of the problems encountered in the state of the art in relation to solar cells, in particular in relation to those solar cells based on wafers with p-type doping on the front face, commonly referred to as n-type solar cells.

More specifically, the invention is further based on the object of producing solar cells with favourable cell efficiency η, fill factor FF, and series resistance $R_{ser}$, particularly in n-type solar cells and in particular with high firing temperatures.

A further object of the invention is to provide processes for preparing solar cells, particularly n-type solar cells.

A contribution to achieving at least one of the above described objects is made by the subject matter of the category forming claims of the invention. A further contribution is made by the subject matter of the dependent claims of the invention which represent specific embodiments of the invention.

DETAILED DESCRIPTION

A contribution to achieving at least one of the above described objects is made by a solar cell precursor comprising as precursor parts i. a wafer with a back face and a front face, wherein the front face comprises a p-doped layer ii. a first paste comprising
   Ag particles;
   Al particles in a range from about 0.01 to about 5 wt. %, preferably in a range from about 0.01 to about 3 wt. %, more preferably in a range from about 0.5 to about 2 wt. %, based on the total weight of the paste;
   a vehicle;
   a glass fit in a range from about 0.1 to about 5 wt. %, preferably in a range from about 0.5 to about 3 wt. %, more preferably in a range from about 1 to about 2 wt. %, based on the total weight of the paste, wherein the glass frit comprises a first glass frit with a glass transition temperature $T_{gl}$ and a further glass fit with a glass transition temperature $T_{gf}$, wherein $T_{gf}$ differs from $T_{gl}$ by at least about 10° C., preferably at least about 20° C., more preferably at least about 50° C.; and
   an additive;
   superimposed on a first area on said p-doped layer.

In one embodiment of the solar cell precursor according to the invention, both $T_{gl}$ and $T_{gf}$ are in a range from about 250° C. to about 530° C., preferably in a range from about 300 to about 500° C., more preferably in a range from about 320 to about 450° C.

In another embodiment of the solar cell precursor according to the invention, the first glass frit and the further glass frit are present in a weight ratio in a range from about 1:5 to about 5:1, preferably in a range from about 1:3 to about 3:1, more preferably in a range from about 1:2 to about 2:1.

In another embodiment of the solar cell precursor according to the invention, the first paste satisfies at least one of the following criteria:

The viscosity of the first paste is in a range from about 5 to about 35 Pas, preferably in a range from about 10 to about 25 Pa·s, more preferably in a range from about 15 to about 20 Pa·s;

All solvents present in the paste have a boiling point in a range from about 90 to about 300° C.

In another embodiment of the invention, the silver particles have a $d_{50}$ in a range from about 1 to about 4 μm, preferably in a range from about 2 to about 3.5 μm, more preferably in a range from about 2.8 to about 3.2 μm.

In one embodiment of the invention, the glass frit particles have a $d_{50}$ in a range from about 0.1 to about 3 μm, preferably in a range from about 0.5 to about 2 μm, more preferably in a range from about 0.8 to about 1.5 μm.

In one embodiment of the invention, the aluminium particles have a $d_{50}$ in a range from about 1 to about 5 μm, preferably in a range from about 2 to about 4 μm, more preferably in a range from about 2.5 to about 3.5 μm.

In a further embodiment of the invention, the first electroconductive paste satisfies at least one of the following conditions:

The Al particles have a $d_{50}$ in a range from 1 to 5 μm, preferably in a range from 2 to 4 μm, more preferably in a range from 2.5 to 3.5 μm.

The Ag particles have a $d_{50}$ in a range from 1 to 4 μm, preferably in a range from 2 to 3.5 μm, more preferably in a range from 2.8 to 3.2 μm.

The glass frit particles have a $d_{50}$ in a range from 0.1 to 3 μm, preferably in a range from 0.5 to 2 μm, more preferably in a range from 0.8 to 1.5 μm.

In another embodiment of the solar cell precursor according to the invention, the Ag particles are spherical.

In another embodiment of the solar cell precursor according to the invention, the solar cell precursor further comprises a further paste superimposed on a further area on the back face. In one aspect of this embodiment, the first area is smaller than the further area. In another aspect of this embodiment, the further paste comprises:

Ag particles;
a vehicle;
a glass frit; and
an additive.

In another embodiment of the solar cell precursor according to the invention, the thickness of the p-doped layer is in a range from about 10 nm to about 4 μm, preferably in a range from about 50 nm to about 1 μm, more preferably in a range from about 100 nm to about 800 nm.

In another embodiment of the solar cell precursor according to the invention, the back face comprises an n-doped layer, wherein the n-doped layer has a greater thickness than the p-doped layer.

In another embodiment of the solar cell precursor according to the invention, the p-doped layer comprises B as a dopant.

In another embodiment of the solar cell precursor according to the invention, the back face comprises an n-doped layer comprising P as a dopant.

In another embodiment of the solar cell precursor according to the invention, one or more layers which act as anti-reflection layer and/or passivation layer are present between the p-doped layer and the superimposed first paste. In one aspect of this embodiment, at least one of the layers which function as anti-reflection layer and/or passivation layer comprises $SiN_x$, wherein x stands for a positive but not necessarily whole number.

In another embodiment of the solar cell precursor according to the invention, the first paste is superimposed on the first area in a grid pattern. In one aspect of this embodiment, the grid pattern of the first paste superimposed on the first area comprises fingers with a width in a range from about 20 to about 100 μm and bus bars at an angle thereto in a range from about 70 to about 90° with a width in a range from about 0.5 to about 2.5 mm.

In another embodiment of the solar cell precursor according to the invention, the solar cell precursor comprises a further paste superimposed on a further area on the back face in a grid pattern. In one aspect of this embodiment, the grid pattern of the further paste superimposed on the further area comprises fingers with a width in a range from about 20 to about 200 μm and bus bars at an angle thereto in a range from about 70 to about 90° with a width in a range from about 0.5 to about 2.5 mm.

A contribution to achieving at least one of the above described objects is made by a process for producing a solar cell comprising the steps:

providing the solar cell precursor according to any of the preceding claims;

firing the solar cell precursor in order to obtain the solar cell.

In one embodiment of the process according to the invention, firing of said solar cell precursor satisfies at least one of the following criteria:

holding temperature measured according to the method titled "temperature profile in the firing furnace" given below, in a range from about 700 to about 900° C.;

time at the holding temperature in a range from about 1 to about 10 s.

In one embodiment of the process according to the invention, the first paste is applied to the front face through a screen. In one aspect of this embodiment, the application through a screen satisfies at least one of the following parameters:

mesh count in a range from about 290 to about 400/inch;
wire thickness in a range from about 10 to about 30 μm;
emulsion over mesh (EoM) thickness in a range from about 5 to about 25 μm;
finger spacing in a range from about 1 to about 3 mm;

A contribution to achieving at least one of the above described objects is made by a solar cell obtainable from a process according to the invention.

A contribution to achieving at least one of the above described objects is made by a module comprising at least 1 solar cell according to the invention and at least another solar cell.

The above embodiments can be combined amongst each other. Each possible combination is herewith a part of the disclosure of the specification.

Wafers

Preferred wafers according to the invention are regions among other regions of the solar cell capable of absorbing light with high efficiency to yield electron-hole pairs and separating holes and electrons across a boundary with high efficiency, preferably across a so called p-n junction boundary. Preferred wafers according to the invention are those comprising a single body made up of a front doped layer and a back doped layer.

It is preferred for that wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary compounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the invention for the wafer to be based on Si. Si, as the most preferred material for the wafer, is referred to explicitly throughout the rest of this application. Sections of the following text in which Si is explicitly mentioned also apply for the other wafer compositions described above.

Where the front doped layer and back doped layer of the wafer meet is the p-n junction boundary. In an n-type solar cell, the back doped layer is doped with electron donating n-type dopant and the front doped layer is doped with electron accepting or hole donating p-type dopant. In a p-type solar cell, the back doped layer is doped with p-type dopant and the front doped layer is doped with n-type dopant. It is preferred according to the invention to prepare a wafer with a p-n junction boundary by first providing a doped Si substrate and then applying a doped layer of the opposite type to one face of that substrate. n-type solar cells are preferred in the context of the invention. In another embodiment of the invention the p-doped layer and a n-doped layer can be arranged at the same face of the wafer. This wafer design is often called interdigitated back contact as exemplified in Handbook of Photovoltaic Science and Engineering, $2^{nd}$ Edition, John Wiley & Sons, 2003, chapter 7.

Doped Si substrates are well known to the person skilled in the art. The doped Si substrate can be prepared in any way known to the person skilled in the art and which he considers to be suitable in the context of the invention. Preferred sources of Si substrates according to the invention are mono-crystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the invention it is one option for the initial doping of the Si substrate to be carried out simultaneously to its formation by adding dopant to the Si mix. According to the invention it is one option for the application of the front doped layer and the highly doped back layer, if present, to be carried out by gas-phase epitaxy. This gas phase epitaxy is preferably carried out at a temperature in a range from about 500° C. to about 900° C., more preferably in a range from about 600° C. to about 800° C. and most preferably in a range from about 650° C. to about 750° C. at a pressure in a range from about 2 kPa to about 100 kPa, preferably in a range from about 10 to about 80 kPa, most preferably in a range from about 30 to about 70 kPa.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the invention is wafer shaped where that wafer is a cuboid with two dimensions which are similar, preferably equal and a third dimension which is significantly less than the other two dimensions. Significantly less in this context is preferably at least a factor of about 100 smaller.

A variety of surface types are known to the person skilled in the art. According to the invention Si substrates with rough surfaces are preferred. One way to assess the roughness of the substrate is to evaluate the surface roughness parameter for a sub-surface of the substrate which is small in comparison to the total surface area of the substrate, preferably less than one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimising mean square displacement. A higher value of the surface roughness parameter indicates a rougher, more irregular surface and a lower value of the surface roughness parameter indicates a smoother, more even surface. According to the invention, the surface roughness of the Si substrate is preferably modified so as to produce an optimum balance between a number of factors including but not limited to light absorption and adhesion of fingers to the surface.

The two larger dimensions of the Si substrate can be varied to suit the application required of the resultant solar cell. It is preferred according to the invention for the thickness of the Si wafer to lie below about 0.5 mm more preferably below about 0.3 mm and most preferably below about 0.2 mm. Some wafers have a minimum size of about 0.01 mm or more.

It is preferred according to the invention for the front doped layer to be thin in comparison to the back doped layer. In one embodiment of the invention, the p-doped layer has a thickness in a range from about 10 nm to about 4 µm, preferably in a range from about 50 nm to about 1 µm and most preferably in a range from about 100 to about 800 nm.

The front doped layer is commonly thinner than the back doped layer. In one embodiment of the invention, the back face comprises an n-doped layer which has a greater thickness than the p-doped layer.

A highly doped layer can be applied to the back face of the Si substrate between the back doped layer and any further layers. Such a highly doped layer is of the same doping type as the back doped layer and such a layer is commonly denoted with a +($n^+$-type layers are applied to n-type back doped layers and $p^+$-type layers are applied to p-type back doped layers). This highly doped back layer serves to assist metallisation and improve electro-conductive properties at the substrate/electrode interface area. It is preferred according to the invention for the highly doped back layer, if present, to have a thickness in a range from about 10 nm to about 30 µm, preferably in a range from about 50 nm to about 20 µm and most preferably in a range from about 100 nm to about 10 µm.

Dopants

Preferred dopants are those which, when added to the Si wafer, form a p-n junction boundary by introducing electrons or holes into the band structure. It is preferred according to the invention that the identity and concentration of these dopants be specifically selected so as to tune the band structure profile of the p-n junction and set the light absorption and conductivity profiles as required. Preferred p-type dopants according to the invention are those which add holes to the Si wafer band structure. They are well known to the person skilled in the art. All dopants known to the person skilled in the art and which he considers to be suitable in the context of the invention can be employed as p-type dopant.

Preferred p-type dopants according to the invention are trivalent elements, particularly those of group 13 of the periodic table. Preferred group 13 elements of the periodic table in this context include but are not limited to B, Al, Ga, In, Tl or a combination of at least two thereof, wherein B is particularly preferred. In one embodiment of the invention, the p-doped layer comprises B as a dopant.

Preferred n-type dopants according to the invention are those which add electrons to the Si wafer band structure. They are well known to the person skilled in the art. All dopants known to the person skilled in the art and which he considers to be suitable in the context of the invention can be employed as n-type dopant. Preferred n-type dopants according to the invention are elements of group 15 of the periodic table. Preferred group 15 elements of the periodic table in this context include N, P, As, Sb, Bi or a combination of at least two thereof, wherein P is particularly preferred. In one embodiment of the invention, the n-doped layer comprises P as dopant.

As described above, the various doping levels of the p-n junction can be varied so as to tune the desired properties of the resulting solar cell.

According to the invention, it is preferred for the back doped layer to be lightly doped, preferably with a dopant concentration in a range from about $1\times10^{13}$ to about $1\times10^{18}$ cm$^{-3}$, preferably in a range from about $1\times10^{14}$ to about $1\times10^{17}$ cm$^{-3}$, most preferably in a range from about $5\times10^{15}$ to about $5\times10^{16}$ cm$^{-3}$. Some commercial products have a back doped layer with a dopant concentration of about $1\times10^{16}$.

In on embodiment of the invention, the highly doped back layer (if one is present) is highly doped, preferably with a concentration in a range from about $1\times10^{17}$ to about $5\times10^{21}$ cm$^{-3}$, more preferably in a range from about $5\times10^{17}$ to about $5\times10^{20}$ cm$^{-3}$, and most preferably in a range from about $1\times10^{18}$ to about $1\times10^{20}$ cm$^{-3}$.

Electro-Conductive Paste

Preferred electro-conductive pastes according to the invention are pastes which can be applied to a surface and which, on firing, form solid electrode bodies in electrical contact with that surface. The constituents of the paste and proportions thereof can be selected by the person skilled in the art in order that the paste have the desired properties such as sintering and printability and that the resulting electrode have the desired electrical and physical properties. Metallic particles can be present in the paste, primarily in order that the resulting electrode body be electrically conductive. In order to bring about appropriate sintering through surface layers and into the Si wafer, an inorganic reaction system can be employed. An example composition of an electrically-conductive paste which is preferred in the context of the invention might comprise:

i) metallic particles, preferably at least about 50 wt. %, more preferably at least about 70 wt. % and most preferably at least about 80 wt. %;
ii) Al particles, preferably in a range from about 0.01 to about 5 wt. %, preferably in a range from about 0.01 to about 3 wt. %, more preferably in a range from about 0.5 to about 2 wt. %;
iii) glass frit, preferably in a range from about 0.1 to about 5 wt. %, more preferably in a range from about 0.5 to about 3 wt. % and most preferably in a range from about 1 to about 2 wt. %, wherein the glass fit comprises a first glass fit with a glass transition temperature $T_{gl}$ and a further glass frit with a glass transition temperature $T_{gf}$, wherein $T_{gf}$ differs from $T_{gl}$ by at least about 10° C., preferably at least about 20° C., more preferably at least about 50° C.;
iv) organic vehicle, preferably in a range from about 5 to about 40 wt. %, more preferably in a range from about 5 to about 30 wt. % and most preferably in a range from about 5 to about 15 wt. %; and
v) additives, preferably in a range from about 0 to about 15 wt. %, more preferably in a range from about 0 to about 10 wt. % and most preferably in a range from about 1 to about 5 wt. %.

wherein the wt. % are each based on the total weight of the electro-conductive paste and add up to 100 wt. %.

In order to facilitate printability of the electro-conductive paste, it is preferred according to the invention for the electro-conductive paste to have a viscosity and thixotropic index which facilitate printability. It is also preferred all solvents in the paste have a boiling point above the temperatures at during the printing process, but below the temperatures of the firing process. In one embodiment of the invention, the electro-conductive paste satisfies at least one of the following criteria:

viscosity in a range from about 5 to about 35 Pas, preferably in a range from about 10 to about 25 Pas and most preferably in a range from about 15 to about 20 Pas.

all solvents present in the paste have a boiling point in a range from about 90 to about 300° C.

Metallic Particles

Preferred metallic particles in the context of the invention are those which exhibit metallic conductivity or which yield a substance which exhibits metallic conductivity on firing. Metallic particles present in the electro-conductive paste give metallic conductivity to the solid electrode which is formed when the electro-conductive paste is sintered on firing. Metallic particles which favour effective sintering and yield electrodes with high conductivity and low contact resistance are preferred. Metallic particles are well known to the person skilled in the art. All metallic particles known to the person skilled in the art and which he considers suitable in the context of the invention can be employed as the metallic particles in the electro-conductive paste. Preferred metallic particles according to the invention are metals, alloys, mixtures of at least two metals, mixtures of at least two alloys or mixtures of at least one metal with at least one alloy.

Preferred metals which can be employed as metallic particles according to the invention are Ag, Cu, Al, Zn, Pd, Ni, Pb and mixtures of at least two thereof, preferably Ag. Preferred alloys which can be employed as metallic particles according to the invention are alloys containing at least one metal selected from the list of Ag, Cu, Al, Zn, Ni, W, Pb, and Pd or mixtures or two or more of those alloys.

It is preferred according to the invention for the metallic particles to comprise Ag and Al.

In one embodiment of the invention, the metallic particles comprise a metal or alloy coated with one or more further different metals or alloys, for example copper coated with silver.

As additional constituents of the metallic particles, further to above mentioned constituents, those constituents which contribute to more favourable sintering properties, electrical contact, adhesion and electrical conductivity of the formed electrodes are preferred according to the invention. All additional constituents known to the person skilled in the art and which he considers to be suitable in the context of the invention can be employed in the metallic particles. Those additional substituents which represent complementary dopants for the face to which the electro-conductive paste is to be applied are preferred according to the invention. When forming an electrode interfacing with an n-type doped Si layer, additives capable of acting as n-type dopants in Si are preferred. Preferred n-type dopants in this context are group 15 elements or compounds which yield such elements on firing. Preferred group 15 elements in this context according to the invention are P and Bi. When forming an electrode interfacing with a p-type doped Si layer, additives capable of acting as p-type dopants in Si are preferred. Preferred p-type dopants are group 13 elements or compounds which yield such elements on firing. Preferred group 13 elements in this context according to the invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favours advantageous sintering, electrical contact, adhesion and electrical conductivity of the produced electrode are preferred according to the invention. One way to characterise such shapes without considering surface nature is through the parameters length, width and thickness. In the context of the invention the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle. In one embodiment according to the invention, metallic particles with as uniform a shape as possible are preferred i.e. shapes in which the ratios relating the length, the width and the thickness are as close as possible to 1, preferably all ratios lying in a range from about 0.7 to about 1.5, more preferably in a range from about 0.8 to about 1.3 and most preferably in a range from about 0.9 to about 1.2. Examples of preferred shapes for the metallic particles in this embodiment are therefore spheres and cubes, or combinations thereof, or combinations of one or more thereof with other shapes. In one embodiment of the invention, the Ag particles in the electro-conductive paste are spherical. In another embodiment according to the invention, metallic particles are preferred which have a shape of low uniformity, preferably with at least one of the ratios relating the dimensions of length, width and thickness being above about 1.5, more preferably above about 3 and most preferably above about 5. Preferred shapes according to this embodiment are flake shaped, rod or needle shaped, or a combination of flake shaped, rod or needle shaped with other shapes.

A variety of surface types are known to the person skilled in the art. Surface types which favour effective sintering and yield advantageous electrical contact and conductivity of produced electrodes are favoured for the surface type of the metallic particles according to the invention.

The particles diameter $d_{50}$ and the associated values $d_{10}$ and $d_{90}$ are characteristics of particles well known to the person skilled in the art. It is preferred according to the invention that the average particle diameter $d_{50}$ of the metallic particles lie in a range from about 0.5 to about 10 µm, more preferably in a range from about 1 to about 10 µm and most preferably in a range from about 1 to about 5 µm. The determination of the particle diameter $d_{50}$ is well known to a person skilled in the art.

In one embodiment of the invention, the silver particles have a $d_{50}$ in a range from about 1 to about 4 µm, preferably in a range from about 2 to about 3.5 µm, more preferably in a range from about 2.8 to about 3.2 µm.

In another embodiment of the invention, the aluminium particles have a $d_{50}$ in a range from about 1 to about 5 µm, preferably in a range from about 2 to about 4 µm, more preferably in a range from about 2.5 to about 3.5 µm.

The metallic particles may be present with a surface coating. Any such coating known to the person skilled in the art and which he considers to be suitable in the context of the invention can be employed on the metallic particles. Preferred coatings according to the invention are those coatings which promote improved printing, sintering and etching characteristics of the electro-conductive paste. If such a coating is present, it is preferred according to the invention for that coating to correspond to no more than about 10 wt. %, preferably no more than about 8 wt. %, most preferably no more than about 5 wt. %, in each case based on the total weight of the metallic particles.

In one embodiment according to the invention, the silver particles, are present as a proportion of the electro-conductive paste more than about 50 wt. %, preferably more than about 70 wt. %, most preferably more than about 80 wt. %.

Glass Frit

Preferred glass fits in the context of the invention are powders of amorphous or partially crystalline solids which exhibit a glass transition. The glass transition temperature $T_g$ is the temperature at which an amorphous substance transforms from a rigid solid to a partially mobile undercooled melt upon heating. Methods for the determination of the glass transition temperature are well known to the person skilled in the art. Glass frit is present in the electro-conductive paste according to the invention in order to bring about etching and sintering. Effective etching is required to etch through any additional layers which may have been applied to the Si wafer and thus lie between the front doped layer and the applied electro-conductive paste as well as to etch into the Si wafer to an appropriate extent. Appropriate etching of the Si wafer means deep enough to bring about good electrical contact between the electrode and the front doped layer and thus lead to a low contact resistance but not so deep as to interfere with the p-n junction boundary. The etching and sintering brought about by the glass frit occurs above the glass transition temperature of the glass frit and the glass transition temperature must lie below the desired peak firing temperature. Glass frits are well known to the person skilled in the art. All glass fits known to the person skilled in the art and which he considers suitable in the context of the invention can be employed as the glass frit in the electro-conductive paste.

In the context of the invention, the glass frit present in the electro-conductive paste preferably comprises elements, oxides, compounds which generate oxides on heating, other compounds, or mixtures thereof. Preferred elements in this context are Si, B, Al, Bi, Li, Na, Mg, Pb, Zn, Gd, Ce, Zr, Ti, Mn, Sn, Ru, Co, Fe, Cu, Ba and Cr or mixtures of two or more from this list. Preferred oxides which can be comprised by the glass frit in the context of the invention are alkali metal oxides, alkali earth metal oxides, rare earth oxides, group V and group VI oxides, other oxides, or combinations thereof. Preferred alkali metal oxides in this context are sodium oxide, lithium oxide, potassium oxide, rubidium oxides, caesium oxides or combinations thereof. Preferred alkali earth metal oxides in this context are beryllium oxide, magnesium oxide, calcium oxide, strontium oxide, barium oxide, or combinations thereof. Preferred group V oxides in this context are phosphorous oxides, such as $P_2O_5$, bismuth oxides, such as $Bi_2O_3$, or combinations thereof. Preferred group VI oxides in this context are tellurium oxides, such as $TeO_2$, or $TeO_3$, selenium oxides, such as $SeO_2$, or combinations thereof. Preferred rare earth oxides are cerium oxide, such as $CeO_2$ and lanthanum oxides, such as $La_2O_3$. Other preferred oxides in this context are silicon oxides, such as $SiO_2$, zinc oxides, such as ZnO, aluminium oxides, such as $Al_2O_3$, germanium oxides, such as $GeO_2$, vanadium oxides, such as $V_2O_5$, niobium oxides, such as $Nb_2O_5$, boron oxide, tungsten oxides, such as $WO_3$, molybdenum oxides, such as $MoO_3$, and indium oxides, such as $In_2O_3$, further oxides of those elements listed above as preferred elements, or combinations thereof. Preferred oxides are also mixed oxides containing at least two of the elements listed as preferred elemental constituents of the frit glass, or mixed oxides which are formed by heating at least one of the above named oxides with at least one of the above named metals. Mixtures of at least two of the above-listed oxides and mixed oxides are also preferred in the context of the invention.

In one embodiment of the invention, the glass frit comprises the first glass frit with glass transition temperature $T_{gl}$ described above and the further glass frit with glass transition temperature $T_{gf}$ described above and no other glass frit.

In one embodiment of the invention, it is preferred for the glass frit to comprise at least three or more glass frits, preferably each with a glass transition temperature differing from that of each of the other glass frits by at least 10 K or more, preferably by at least 20 K or more, more preferably by at least 50 K or more. In one embodiment of the invention, the glass frit comprises three glass frits, including the first and further glass frits described above, a third glass frit and no other glass frit.

As mentioned above, the glass fit must have a glass transition temperature below the desired firing temperature of the electro-conductive paste. In one embodiment of the invention both $T_{gl}$ and $T_{gf}$, and preferably also the glass transition temperature of a third or other glass frit. where such third or other glasses present in the glass frit, are preferably in a range from about 250 to about 530° C., more preferably in a range from about 300 to about 500° C., and most preferably in a range from about 320 to about 450° C.

In one embodiment of the invention, it is preferred for the first glass frit and the second glass frit to be present in a weight ratio in a range from about 1:5 to about 5:1. In one aspect of this embodiment, where more than two glass frits are present, it is preferred for each weight ratio between any two glass fits of the glass fits to be in a range from about 1:5 to about 5:1, preferably in a range from about 1:3 to about 3:1, more preferably in a range from about 1:2 to about 2:1. In the case where three glass frits are present, for example, it is preferred for the weight ratio of the first to the second glass frit, the first to the third glass frit and the second to the third glass frit all to be in a range from about 1:5 to about 5:1, preferably in a range from about 1:3 to about 3:1, more preferably in a range from about 1:2 to about 2:1.

It is well known to the person skilled in the art that glass frit particles can exhibit a variety of shapes, surface natures, sizes, surface area to volume ratios, and coating layers. A large number of shapes of glass fit particles are known to the person skilled in the art. Some examples are spherical, angular, elongated (rod or needle like) and flat (sheet like). Glass frit particles may also be present as a combination of particles of different shapes. Glass frit particles with a shape, or combination of shapes, which favours advantageous sintering, adhesion, electrical contact and electrical conductivity of the produced electrode are preferred according to the invention.

The average particles diameter $d_{50}$, and the associated parameters $d_{10}$ and $d_{90}$ are characteristics of particles well known to the person skilled in the art. It is preferred according to the invention that the average particle diameter $d_{50}$ of the glass frit lies in a range from about 0.1 to about 10 μm, more preferably in a range from about 0.2 to about 7 μm and most preferably in a range from about 0.5 to about 5 μm.

In one embodiment of the invention, the glass fit particles have a $d_{50}$ in a range from about 0.1 to about 3 μm, preferably in a range from about 0.5 to about 2 μm, more preferably in a range from about 0.8 to about 1.5 μm.

Organic Vehicle

Preferred organic vehicles in the context of the invention are solutions, emulsions or dispersions based on one or more solvents, preferably an organic solvent, which ensure that the constituents of the electro-conductive paste are present in a dissolved, emulsified, or dispersed form. Preferred organic vehicles are those which provide optimal stability of constituents within the electro-conductive paste and endow the electro-conductive paste with a viscosity allowing effective line printability. Preferred organic vehicles according to the invention comprise as vehicle components:

(i) a binder, preferably in a range from about 1 to about 10 wt. %, more preferably in a range from about 2 to about 8 wt. % and most preferably in a range from about 3 to about 7 wt. %;

(ii) a surfactant, preferably in a range from about 0 to about 10 wt. %, more preferably in a range from about 0 to about 8 wt. % and most preferably in a range from about 0.01 to about 6 wt. %;

(ii) one or more solvents, the proportion of which is determined by the proportions of the other constituents in the organic vehicle;

(iv) optional additives, preferably in range from about 0 to about 10 wt. %, more preferably in a range from about 0 to about 8 wt. % and most preferably in a range from about 1 to about 5 wt. %, wherein the wt. % are each based on the total weight of the organic vehicle and add up to 100 wt. %. According to the invention preferred organic vehicles are those which allow for the preferred high level of printability of the electro-conductive paste described above to be achieved.

Binder

Preferred binders in the context of the invention are those which contribute to the formation of an electro-conductive paste with favourable stability, printability, viscosity, sintering and etching properties. Binders are well known to the person skilled in the art. All binders which are known to the person skilled in the art and which he considers to be suitable in the context of this invention can be employed as the binder in the organic vehicle. Preferred binders according to the invention (which often fall within the category termed "resins") are polymeric binders, monomeric binders, and binders which are a combination of polymers and monomers. Polymeric binders can also be copolymers wherein at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. Preferred polymers which carry cyclic groups in the main chain are polyvinylbutylate (PVB) and its derivatives and polyterpineol and its derivatives or mixtures thereof. Preferred poly-sugars are for example cellulose and alkyl derivatives thereof, preferably methyl cellulose, ethyl cellulose, propyl cellulose, butyl cellulose and their derivatives and mixtures of at least two thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders according to the invention are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the invention.

Surfactant

Preferred surfactants in the context of the invention are those which contribute to the formation of an electro-conductive paste with favourable stability, printability, viscosity, sintering and etching properties. Surfactants are well known to the person skilled in the art. All surfactants which are known to the person skilled in the art and which he considers to be suitable in the context of this invention can be employed as the surfactant in the organic vehicle. Preferred surfactants in the context of the invention are those based on linear chains, branched chains, aromatic chains, fluorinated chains, siloxane chains, polyether chains and combinations thereof. Preferred surfactants are single chained double chained or poly chained. Preferred surfactants according to the invention have non-ionic, anionic, cationic, or zwitterionic heads. Preferred surfactants are polymeric and monomeric or a mixture thereof. Preferred surfactants according to the invention can have pigment affinic groups, preferably hydroxyfunctional carboxylic acid esters with pigment affinic groups (e.g., DISPERBYK®-108, manufactured by BYK USA, Inc.), acrylate copolymers with pigment affinic groups (e.g., DISPERBYK®-116, manufactured by BYK USA, Inc.), modified polyethers with pigment affinic groups (e.g., TEGO® DISPERS 655, manufactured by Evonik Tego Chemie GmbH), other surfactants with groups of high pigment affinity (e.g., TEGO® DISPERS 662 C, manufactured by Evonik Tego Chemie GmbH). Other preferred polymers according to the invention not in the above list are polyethyleneglycol and its derivatives, and alkyl carboxylic acids and their derivatives or salts, or mixtures thereof. The preferred polyethyleneglycol derivative according to the invention is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant according to the invention is benzotriazole and its derivatives.

Solvent

Preferred solvents according to the invention are constituents of the electro-conductive paste which are removed from the paste to a significant extent during firing, preferably those which are present after firing with an absolute weight reduced by at least about 80% compared to before firing, preferably reduced by at least about 95% compared to before firing. Preferred solvents according to the invention are those which allow an electro-conductive paste to be formed which has favourable viscosity, printability, stability and sintering characteristics and which yields electrodes with favourable electrical conductivity and electrical contact to the substrate. Solvents are well known to the person skilled in the art. All solvents which are known to the person skilled in the art and which he considers to be suitable in the context of this invention can be employed as the solvent in the organic vehicle. According to the invention preferred solvents are those which allow the preferred high level of printability of the electro-conductive paste as described above to be achieved. Preferred solvents according to the invention are those which exist as a liquid under standard ambient temperature and pressure (SATP) (298.15 K, 100 kPa), preferably those with a boiling point above about 90° C. and a melting point above about −20° C. Preferred solvents according to the invention are polar or non-polar, protic or aprotic, aromatic or non-aromatic. Preferred solvents according to the invention are mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated-bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least 2 of the aforementioned.

Additives in the Organic Vehicle

Preferred additives in the organic vehicle are those additives which are distinct from the aforementioned vehicle components and which contribute to favourable properties of the electro-conductive paste, such as advantageous viscosity, sintering, electrical conductivity of the produced electrode and good electrical contact with substrates. All additives known to the person skilled in the art and which he considers to be suitable in the context of the invention can be employed as additive in the organic vehicle. Preferred additives according to the invention are thixotropic agents, viscosity regulators, stabilising agents, inorganic additives, thickeners, emulsifiers, dispersants or pH regulators. Preferred thixotropic agents in this context are carboxylic acid derivatives, preferably fatty acid derivatives or combinations thereof. Preferred fatty acid derivatives are $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid) or combinations thereof. A preferred combination comprising fatty acids in this context is castor oil.

Additives in the Electro-Conductive Paste

Preferred additives in the context of the invention are constituents added to the electro-conductive paste, in addition to the other constituents explicitly mentioned, which contribute to increased performance of the electro-conductive paste, of the electrodes produced thereof or of the resulting solar cell. All additives known to the person skilled in the art and which he considers suitable in the context of the invention can be employed as additive in the electro-conductive paste. In addition to additives present in the vehicle, additives can also be present in the electro-conductive paste. Preferred additives according to the invention are thixotropic agents, viscosity regulators, emulsifiers, stabilising agents or pH regulators, inorganic additives, thickeners and dispersants or a combination of at least two thereof, whereas inorganic additives are most preferred. Preferred inorganic additives in this context according to the invention are Mg, Ni, Te, W, Zn, Mg, Gd, Ce, Zr, Ti, Mn, Sn, Ru, Co, Fe, Cu and Cr or a combination of at least two thereof, preferably Zn, Sb, Mn, Ni, W, Te and Ru or a combination of at least two thereof, oxides thereof, compounds which can generate those metal oxides on firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned.

Process for Producing a Solar Cell

A contribution to achieving at one of the aforementioned objects is made by a process for producing a solar cell at least comprising the following as process steps:
i) provision of a solar cell precursor as described above, in particular combining any of the above described embodiments; and
ii) firing of the solar cell precursor to obtain a solar cell.

Printing

It is preferred according to the invention that the front and back electrodes are applied by applying an electro-conductive paste and then firing said electro-conductive paste to obtain a sintered body. The electro-conductive paste can be applied in any manner known to the person skilled in that art and which he considers suitable in the context of the invention including but not limited to impregnation, dipping, pouring, dripping on, injection, spraying, knife coating, curtain coating, brushing or printing or a combination of at least two thereof, wherein preferred printing techniques are ink jet printing, screen printing, tampon printing, offset printing, relief printing or stencil printing or a combination of at least two thereof. It is preferred according to the invention that the electro-conductive paste is applied by printing, preferably by screen printing. In one embodiment of the invention, the electro-conductive paste is applied to the front face through a screen. In one aspect of this embodiment the application through a screen satisfies at least one of the following parameters:

mesh count in a range from about 290 to about 400, preferably in a range from about 310 to about 390, more preferably in a range from about 330 to about 370;

wire thickness in a range from about 10 to about 30 µm, preferably in a range from about 12 to about 25 µm, more preferably in a range from about 15 to about 23 µm;

Emulsion over mesh (EoM) thickness in a range from about 5 to about 25 µm, preferably in a range from about 10 to about 20 µm, more preferably in a range from about 13 to about 18 µm finger spacing in a range from about 1 to about 3 mm, preferably in a range from about 1.8 to about 2.5 mm, more preferably in a range from about 2 to about 2.3 mm.

In one embodiment of the invention, the electro-conductive paste is superimposed on the first area on the front face in a grid pattern. In one aspect of this embodiment, this grid pattern comprises fingers with a width in a range from about 20 to about 100 µm, preferably in a range from about 30 to about 80 µm, more preferably in a range from about 30 to about 60 µm and bus bars at an angle thereto in a range from about 70 to about 90°, these bus bars having a width in a range from about 0.5 to about 2.5 mm, preferably in a range from about 1 to about 2 mm, more preferably in a range from about 1.3 to about 1.8 mm.

In a further embodiment of the invention, an electro-conductive paste is superimposed on the further area on the back face in a grid pattern. In one aspect of this embodiment, this grid pattern comprises fingers with a width in a range from about 20 to about 180 µm, preferably in a range from about 30 to about 100 µm, more preferably in a range from about 40 to about 60 µm and bus bars at an angle thereto in a range from about 70 to about 90°, these bus bars having a width in a range from about 0.5 to about 2.5 mm, preferably in a range from about 1 to about 2 mm, more preferably in a range from about 1.3 to about 1.8 mm.

Firing

It is preferred according to the invention for electrodes to be formed by first applying an electro-conductive paste and then firing said electro-conductive paste to yield a solid electrode body. Firing is well known to the person skilled in the art and can be carried out in any manner known to him and which he considers suitable in the context of the invention. Firing must be carried out above the glass transition temperature of at least one glass frit, preferably of two or more glass frits and more preferably all glass frits present in the paste.

In one embodiment of the invention, the firing stage satisfies at least one of the following criteria:
holding temperature measured according to the method titled "temperature profile in the firing furnace" given below, in a range from about 700 to about 900° C., preferably in a range from about 730 to about 880° C.;
time at the holding temperature in a range from about 1 to about 10 s.

It is preferred according to the invention for firing to be carried out with a holding time in a range from about 10 s to about 2 minutes, more preferably in a range from about 25 s to about 90 s and most preferably in a range from about 40 s to about 1 minute.

Firing of electro-conductive pastes on the front and back faces can be carried out simultaneously or sequentially. Simultaneous firing is appropriate if the electro-conductive pastes applied to both faces have similar, preferably identical, optimum firing conditions. Where appropriate, it is preferred according to the invention for firing to be carried out simultaneously. Where firing is effected sequentially, it is preferable according to the invention for the back electro-conductive paste to be applied and fired first, followed by application and firing of the electro-conductive paste to the front face.

Solar Cell

A contribution to achieving at least one of the above described objects is made by a solar cell obtainable by a process according to the invention. Preferred solar cells according to the invention are those which have a high efficiency in terms of proportion of total energy of incident light converted into electrical energy output and which are light and durable. As exemplified in FIG. 2, one layer configuration for the solar cell is as follows: (i) Front electrode, (ii) Anti reflection coating, (iii) Front passivation layer, (iv) Front doped layer, (v) p-n junction boundary, (vi) Back doped layer, (vii) Highly doped back layer, (viii) Back passivation layer, (ix) Back electrode. Individual layers can be omitted from this common layer configuration or individual layers can indeed perform the function of more than one of the layers described in the common embodiment outlined above. In one embodiment of the invention, a single layer acts as both anti-reflection layer and passivation layer. As exemplified in FIG. 1, another layer configuration is as follows: (I) Front electrode, (II) Front doped layer, (III) p-n junction boundary, (IV) Back doped layer, (V) Back electrode.

Anti-Reflection Coating

According to the invention, an anti-reflection coating can be applied as the outer and often as the outermost layer before the electrode on the front face of the solar cell. Preferred anti-reflection coatings according to the invention are those which decrease the proportion of incident light reflected by the front face and increase the proportion of incident light crossing the front face to be absorbed by the wafer. Anti-reflection coatings which give rise to a favourable absorption/reflection ratio, are susceptible to etching by the employed electro-conductive paste but are otherwise resistant to the temperatures required for firing of the electro-conductive paste, and do not contribute to increased recombination of electrons and holes in the vicinity of the electrode interface are favoured. All anti-reflection coatings known to the person skilled in the art and which he considers to be suitable in the context of the invention can be employed. Preferred anti-reflection coatings according to the invention are $SiN_x$, $SiO_2$, $Al_2O_3$, $TiO_2$ or mixtures of at least two thereof and/or combinations of at least two layers thereof, wherein $SiN_x$ is particularly preferred, in particular where an Si wafer is employed.

The thickness of anti-reflection coatings is suited to the wavelength of the appropriate light. According to the invention it is preferred for anti-reflection coatings to have a thickness in a range from about 20 to about 300 nm, more preferably in a range from about 40 to about 200 nm and most preferably in a range from about 60 to about 90 nm.

Passivation Layers

According to the invention, one or more passivation layers can be applied to the front and/or back side as outer or as the outermost layer before the electrode, or before the anti-reflection layer if one is present. Preferred passivation layers are those which reduce the rate of electron/hole recombination in the vicinity of the electrode interface. Any passivation layer which is known to the person skilled in the art and which he considers to be suitable in the context of the invention can be employed. Preferred passivation layers according to the invention are silicon nitride, silicon dioxide and titanium dioxide, silicon nitride being most preferred. According to the invention, it is preferred for the passivation layer to have a thickness in a range from about 0.1 nm to about 2 µm, more preferably in a range from about 10 nm to about 1 µm and most preferably in a range from about 30 nm to about 200 nm.

A single layer can serve as anti-reflection layer and passivation layer. In one embodiment of the invention, one or more layers which act as anti-reflection layer and/or passivation layer are present between the p-doped layer and the superimposed first paste in the solar cell precursor. In one aspect of this embodiment, at least one of the layers which function as anti-reflection layer and/or passivation layer comprises $SiN_x$, wherein x stands for a positive but not necessarily whole number.

Additional Protective Layers

In addition to the layers described above which directly contribute to the principle function of the solar cell, further layers can be added for mechanical and chemical protection. The cell can be encapsulated to provide chemical protection. Encapsulations are well known to the person skilled in the art and any encapsulation can be employed which is known to him and which he considers suitable in the context of the invention. According to the invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the invention can be employed as protection on the back face of the solar cell. Preferred back protecting materials according to the invention are those having good mechanical properties and weather resistance. The preferred back protection materials according to the invention is polyethylene terephthalate with a layer of polyvinyl fluoride. It is preferred according to the invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the invention can be employed as frame material. The preferred frame material according to the invention is aluminium.

Process

A contribution to achieving at least one of the above mentioned objects is made by a process for producing a solar cell comprising the steps providing a solar cell precursor according to the invention or any of the individual embodiments firing the solar cell precursor in order to obtain a solar cell Solar Panels A contribution to achieving at least one of the above mentioned objects is made by a module comprising at least a solar cell obtained as described above, in particular according to at least one of the above described embodiments, and at least one more solar cell. A multiplicity of solar cells according to the invention can be arranged spatially and electrically connected to form a collective arrangement called a module. Preferred modules according to the invention can take a number of forms, preferably a rectangular surface known as a solar panel. Large varieties of ways to electrically connect solar cells as well as large varieties of ways to mechanically arrange and fix such cells to form collective arrangements are well known to the person skilled in the art and any such methods known to him and which he considers suitable in the context of the invention can be employed. Preferred methods according to the invention are those which result in a low mass to power output ratio, low volume to power output ration, and high durability. Aluminium is the preferred material for mechanical fixing of solar cells according to the invention.

DESCRIPTION OF THE DRAWINGS

The invention is now explained by means of figures which are intended for illustration only and are not to be considered as limiting the scope of the invention. In brief, FIG. 4 shows a perspective view of the solar cell precursor.

FIG. 1 shows a cross sectional view of a solar cell 100 and represents the minimum required layer configuration for a solar cell according to the invention. Starting from the back face and continuing towards the front face the solar cell 100 comprises a back electrode 104, a back doped layer 106, a p-n junction boundary 102, a front doped layer 105 and a front electrode 103, wherein the front electrode penetrates into the front doped layer 105 enough to form a good electrical contact with it, but not so much as to shunt the p-n junction boundary 102. The back doped layer 106 and the front doped layer 105 together constitute a single doped Si wafer 101. In the case that 100 represents an n-type cell, the back electrode 104 is preferably a silver electrode, the back doped layer 106 is preferably Si lightly doped with P, the front doped layer 105 is preferably Si heavily doped with B and the front electrode 103 is preferably a mixed silver and aluminium electrode. In the case that 100 represents a p-type cell, the back electrode 104 is preferably a mixed silver and aluminium electrode, the back doped layer 106 is preferably Si lightly doped with B, the front doped layer 105 is preferably Si heavily doped with P and the front electrode 103 is preferably a silver and aluminium electrode. The front electrode 103 has been represented in FIG. 1 as consisting of three bodies purely to illustrate schematically the fact that the front electrode 103 does not cover the front face in its entirety. The invention does not limit the front electrode 103 to those consisting of three bodies.

FIG. 2 shows a cross sectional view of a common layer configuration for a solar cell 200 according to the invention (excluding additional layers which serve purely for chemical and mechanical protection). Starting from the back face and continuing towards the front face the solar cell 200 comprises a back electrode 104, a back passivation layer 208, a highly doped back layer 210, a back doped layer 106, a p-n junction boundary 102, a front doped layer 105, a front passivation layer 207, an anti-reflection layer 209, front electrode fingers 214 and front electrode bus bars 215, wherein the front electrode fingers penetrate through the anti-reflection layer 209 and the front passivation layer 207 and into the front doped layer 105 far enough to form a good electrical contact with the front doped layer, but not so far as to shunt the p-n junction boundary 102. In the case that 200 represents an n-type cell, the back electrode 104 is preferably a silver electrode, the highly doped back layer 210 is preferably Si heavily doped with P, the back doped layer 106 is preferably Si lightly doped with P, the front doped layer 105 is preferably Si heavily doped with B, the anti-reflection layer 209 is preferably a layer of silicon nitride and the front electrode fingers and bus bars 214 and 215 are preferably a mixture of silver and aluminium. In the case that 200 represents a p-type cell, the back electrode 104 is preferably a mixed silver and aluminium electrode, the highly doped back layer 210 is preferably Si heavily doped with B, the back doped layer 106 is preferably Si lightly doped with B, the front doped layer 105 is preferably Si heavily doped with P, the anti-reflection layer 209 is preferably a layer of silicon nitride and the front electrode fingers and bus bars 214 and 215 are preferably silver. FIG. 2 is schematic and the invention does not limit the number of front electrode fingers to three as shown. This cross sectional view is unable to effectively show the multitude of front electrode bus bars 215 arranged in parallel lines perpendicular to the front electrode fingers 214.

FIGS. 3a, 3b and 3c together illustrate the process of firing a front side paste to yield a front side electrode. FIGS. 3a, 3b and 3c are schematic and generalised and additional layers further to those constituting the p-n junction are considered simply as optional additional layers without more detailed consideration.

FIG. 3a illustrates a wafer before application of front electrode, 300a. Starting from the back face and continuing towards the front face the wafer before application of front electrode 300a optionally comprises additional layers on the back face 311, a back doped layer 106, a p-n junction boundary 102, a front doped layer 105 and additional layers on the front face 312. The additional layers on the back face 311 can comprise any of a back electrode, a back passivation layer, a highly doped back layer or none of the above. The additional layer on the front face 312 can comprise any of a front passivation layer, an anti-reflection layer or none of the above.

FIG. 3b shows a wafer with electro-conductive paste applied to the front face before firing 300b. In addition to the layers present in 300a described above, an electro-conductive paste 313 is present on the surface of the front face.

FIG. 3c shows a wafer with front electrode applied 300c. In addition to the layers present in 300a described above, a front side electrode 103 is present which penetrates from the surface of the front face through the additional front layers 312 and into the front doped layer 105 and is formed from the electro-conductive paste 313 of FIG. 3b by firing.

In FIGS. 3b and 3c, the applied electro-conductive paste 313 and the front electrodes 103 are shown schematically as being present as three bodies. This is purely a schematic way of representing a non-complete coverage of the front face by the paste/electrodes and the invention does not limit the paste/electrodes to being present as three bodies.

FIG. 4 shows a perspective view of the solar cell precursor 400. The precursor comprises a wafer 401, preferably a Si wafer. The wafer 401 comprises an n-doped layer 405, preferably with phosphorous as dopant and a p-doped layer 404, preferably with boron as dopant, which meet at the p-n junction boundary 102. The precursor 400 has a front face 403 where a first paste 408 is superimposed on a first area 407 and a back face 402 where a further paste 409 is superimposed on a further area 406. The precursor optionally comprises an anti-reflection and/or passivation layer 410.

Test Methods

Figure 1:
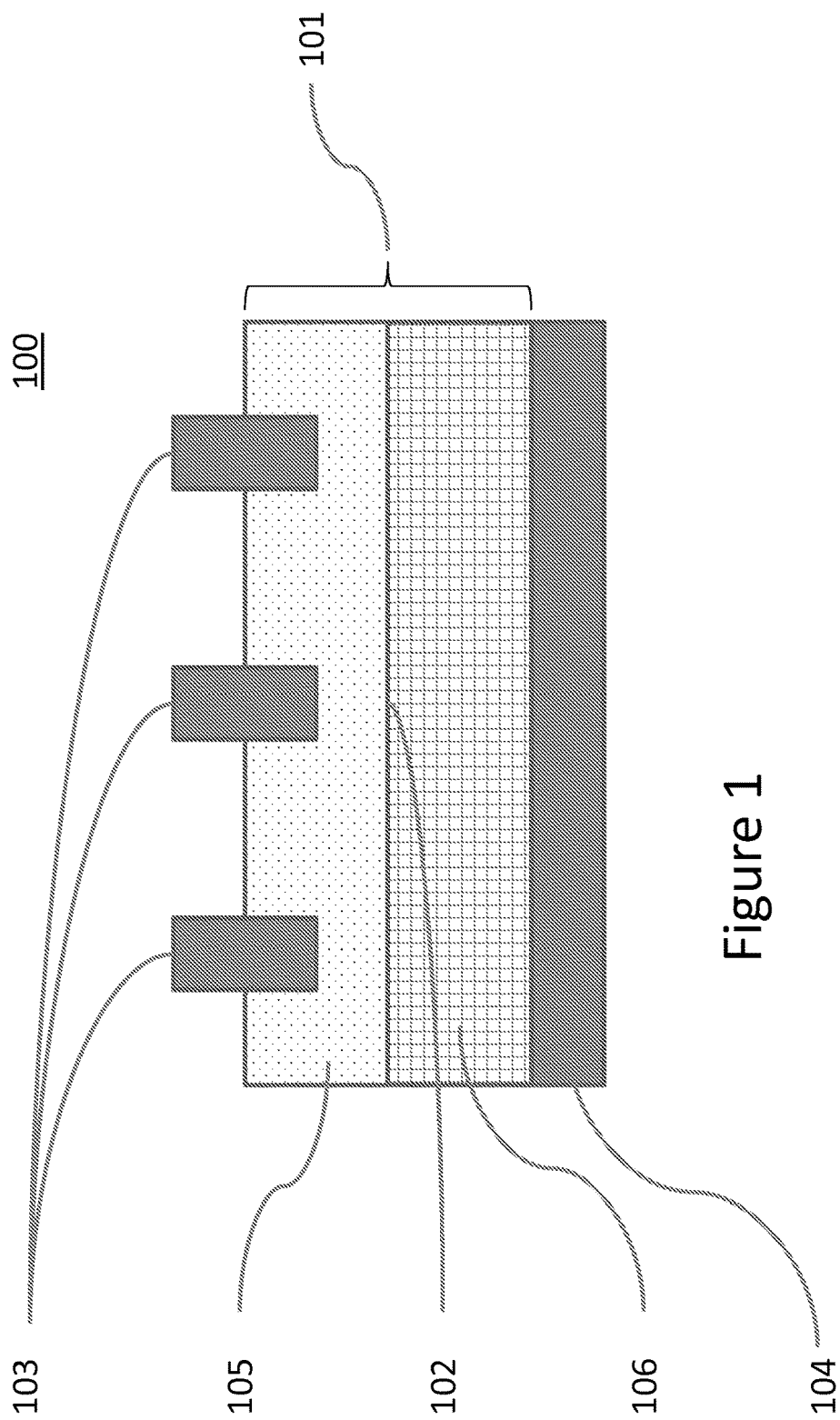
FIG. 1 shows a cross sectional view of the minimum layer configuration for a solar cell.
Figure 2:
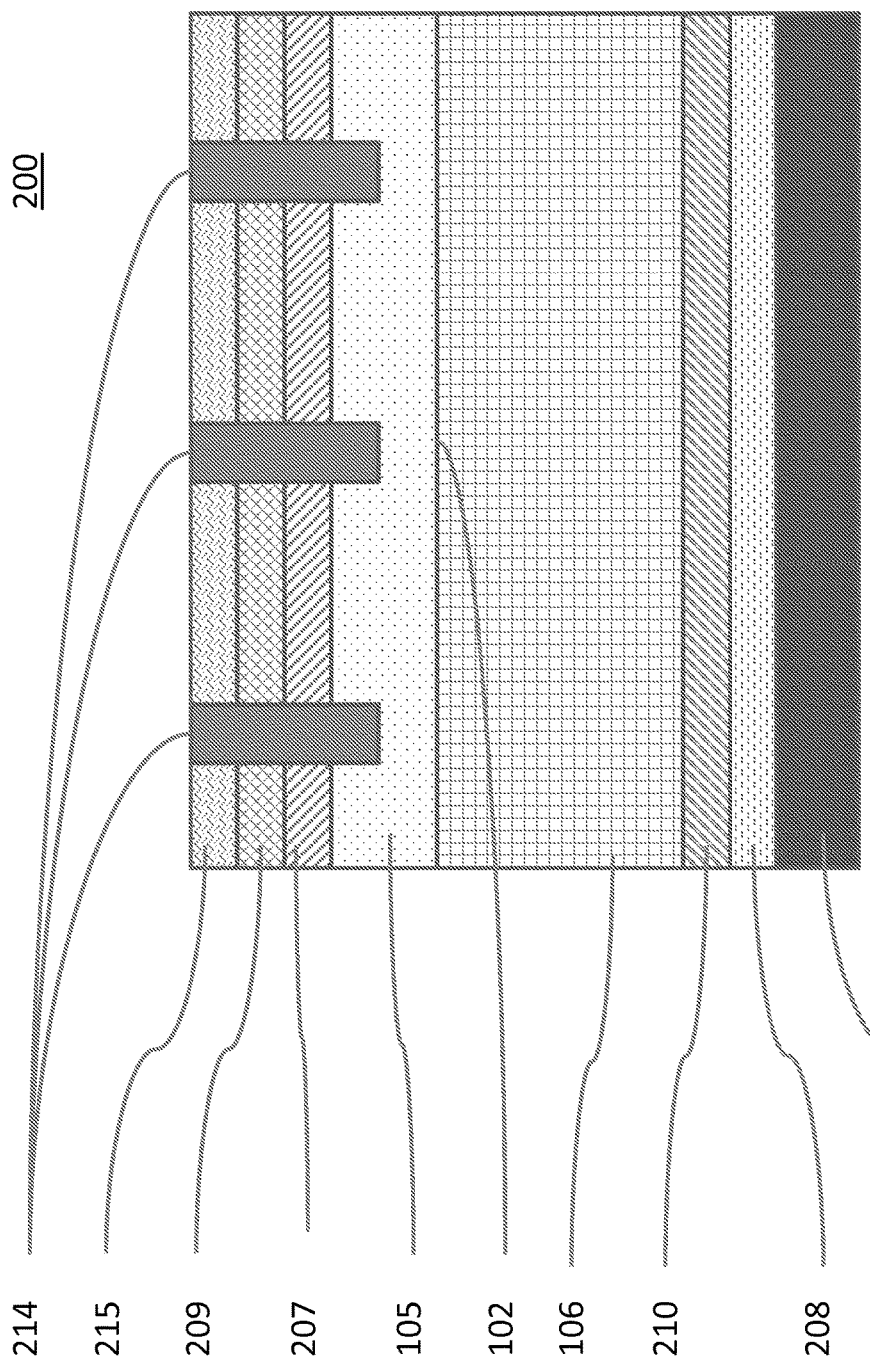
FIG. 2 shows a cross sectional view a common layer configuration for a solar cell, FIGS. 3a, 3b and 3c together illustrate the process of firing a front side paste.
Figure 3B:
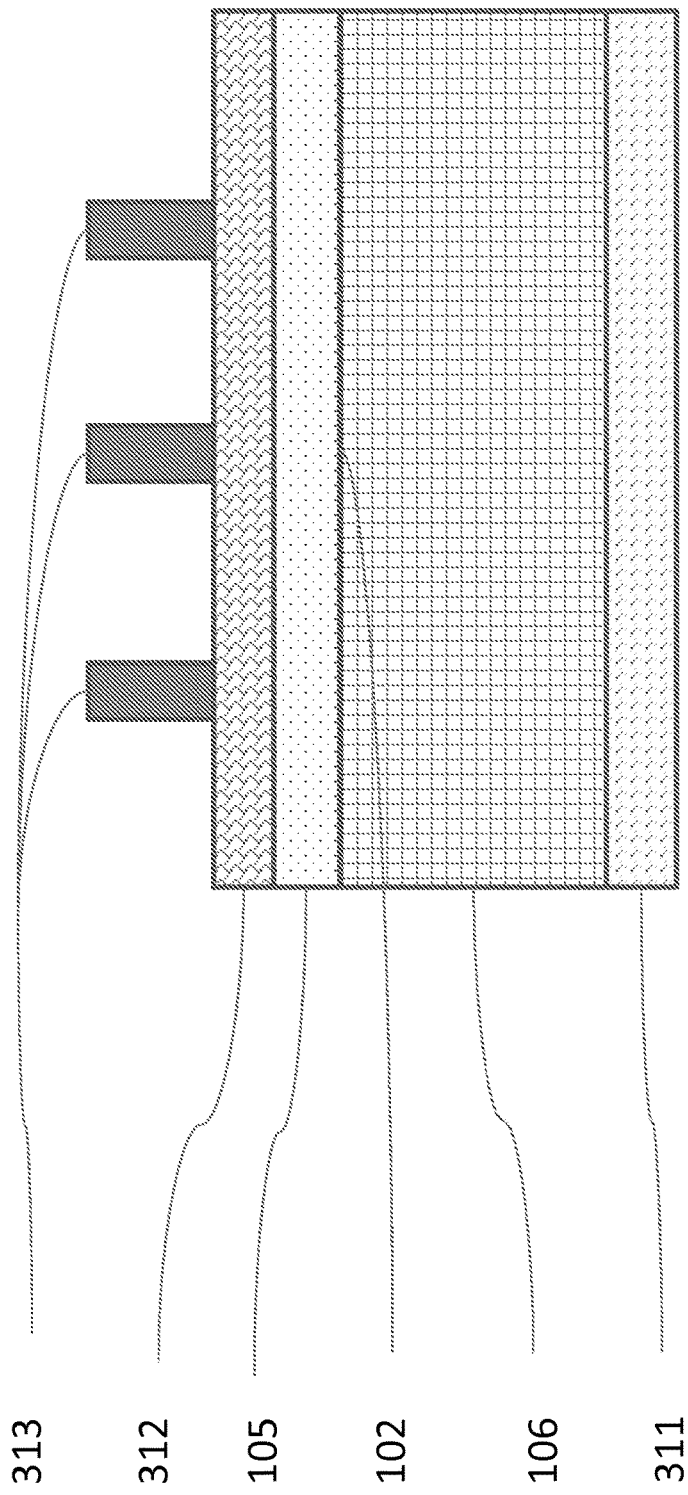
Figure 3C:
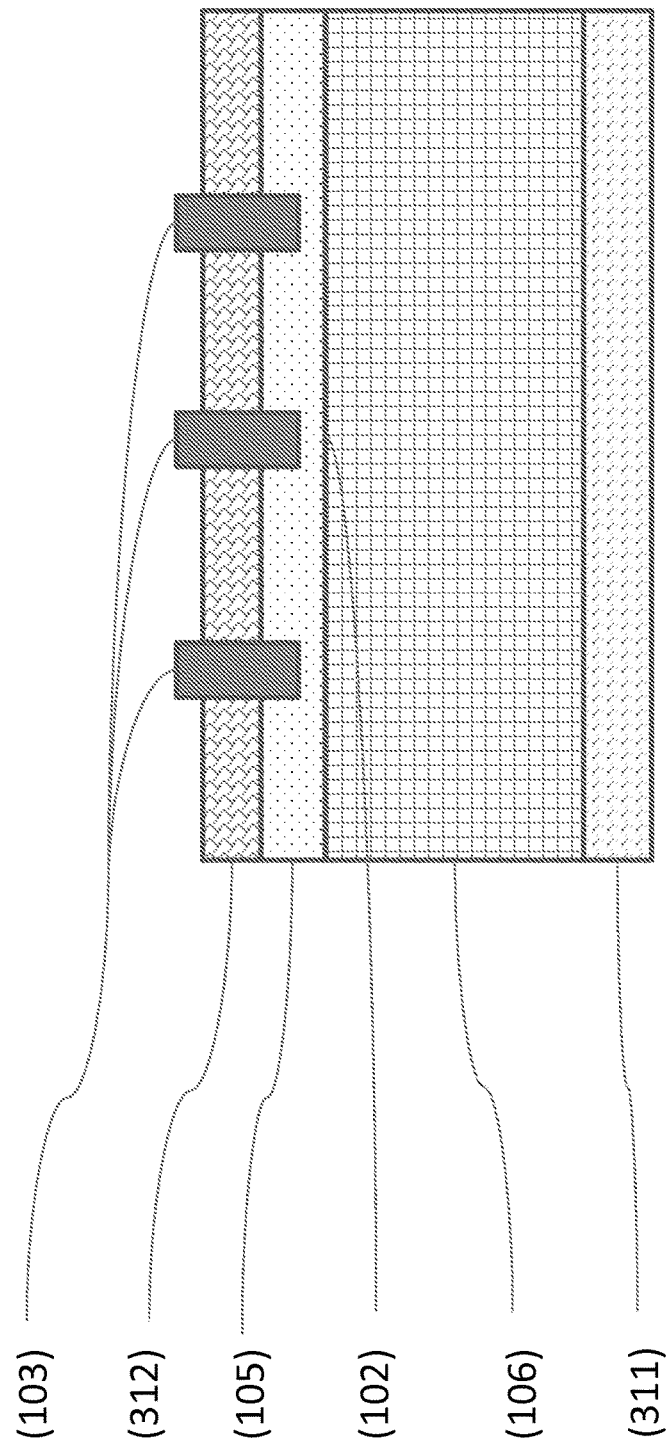

The following test methods are used in the invention. In absence of a test method, the ISO test method for the feature to be measured being closest to the earliest filing date of the present application applies. In absence of distinct measuring conditions, standard ambient temperature and pressure (SATP) (temperature of 298.15 K and an absolute pressure of 100 kPa) apply.

Viscosity

Viscosity measurements were performed using the Thermo Fischer Scientific Corp. "Haake Rheostress 600" equipped with a ground plate MPC60 Ti and a cone plate C 20/0.5° Ti and software "Haake RheoWin Job Manager 4.30.0". After setting the distance zero point, a paste sample sufficient for the measurement was placed on the ground plate. The cone was moved into the measurement positions with a gap distance of 0.026 mm and excess material was removed using a spatula. The sample was equilibrated to 25° C. for three minutes and the rotational measurement started. The shear rate was increased from 0 to 20 $s^{-1}$ within 48 s and 50 equidistant measuring points and further increased to 150 $s^{-1}$ within 312 s and 156 equidistant measuring points. After a waiting time of 60 s at a shear rate of 150 $s^{-1}$, the shear rate was reduced from 150 $s^{-1}$ to 20 $s^{-1}$ within 312 s and 156 equidistant measuring points and further reduced to 0 within 48 s and 50 equidistant measuring points. The micro torque correction, micro stress control and mass inertia correction were activated. The viscosity is given as the measured value at a shear rate of 100 $s^{-1}$ of the downward shear ramp.

Glass Transition Temperature

The glass transition temperature Tg for glasses is determined using a DSC apparatus Netzsch STA 449 F3 Jupiter (Netzsch) equipped with a sample holder HTP 40000A69.010, thermocouple Type S and a platinum oven Pt S TC:S (all from Netzsch). For the measurements and data evaluation the measurement software Netzsch Messung V5.2.1 and *Proteus* Thermal Analysis V5.2.1 are applied. As pan for reference and sample, aluminium oxide pan GB 399972 and cap GB 399973 (both from Netzsch) with a diameter of 6.8 mm and a volume of about 85 µl are used. An amount of about 20-30 mg of the sample is weighted into the sample pan with an accuracy of 0.01 mg. The empty reference pan and the sample pan are placed in the apparatus, the oven is closed and the measurement started. A heating rate of 10 K/min is employed from a starting temperature of 25° C. to an end temperature of 1000° C. The balance in the instrument is always purged with nitrogen ($N_2$ 5.0) and the oven is purged with synthetic air (80% $N_2$ and 20% $O_2$ from Linde) with a flow rate of 50 ml/min. The first step in the DSC signal is evaluated as glass transition using the software described above and the determined onset value is taken as the temperature for Tg.

Particles Size Determination ($d_{10}$, $d_{50}$, $d_{90}$)

Particle size determination for particles is performed in accordance with ISO 13317-3:2001. A Sedigraph 5100 with software Win 5100 V2.03.01 (from Micromeritics) which works according to X-ray gravitational technique is used for the measurement. A sample of about 400 to 600 mg is weighed into a 50 ml glass beaker and 40 ml of Sedisperse P11 (from Micromeritics, with a density of about 0.74 to 0.76 g/cm$^3$ and a viscosity of about 1.25 to 1.9 mPa*s) are added as suspending liquid. A magnetic stirring bar is added to the suspension. The sample is dispersed using an ultrasonic probe Sonifer 250 (from Branson) operated at power level 2 for 8 minutes while the suspension is stirred with the stirring bar at the same time. This pre-treated sample is placed in the instrument and the measurement started. The temperature of the suspension is recorded (typical range 24° C. to 45° C.) and for calculation data of measured viscosity for the dispersing solution at this temperature are used. Using density and weight of the sample (10.5 g/cm$^3$ for silver) the particle size distribution is determined and given as $d_{50}$, $d_{10}$ and $d_{90}$.

Dopant Level

Dopant levels are measured using secondary ion mass spectroscopy.

Efficiency, Fill Factor, and Series Resistance

The sample solar cell is characterized using a commercial IV-tester "cetisPV-CTL1" from Halm Elektronik GmbH. All parts of the measurement equipment as well as the solar cell to be tested were maintained at 25° C. during electrical measurement. This temperature is always measured simultaneously on the cell surface during the actual measurement by a temperature probe. The Xe Arc lamp simulates the sunlight with a known AM1.5 intensity of 1000 W/m$^2$ on the cell surface. To bring the simulator to this intensity, the lamp is flashed several times within a short period of time until it reaches a stable level monitored by the "PVCTControl 4.313.0" software of the IV-tester. The Halm IV tester uses a multi-point contact method to measure current (I) and voltage (V) to determine the cell's IV-curve. To do so, the solar cell is placed between the multi-point contact probes in such a way that the probe fingers are in contact with the bus bars of the cell. The numbers of contact probe lines are adjusted to the number of bus bars on the cell surface. All electrical values were determined directly from this curve automatically by the implemented software package. As a reference standard a calibrated solar cell from ISE Freiburg consisting of the same area dimensions, same wafer material and processed using the same front side layout is tested and the data compared to the certificated values. At least 5 wafers processed in the very same way are measured and the data interpreted by calculating the average of each value.

The software PVCTControl 4.313.0 provides values for efficiency, fill factor, short circuit current, series resistance and open circuit voltage.

Temperature Profile in the Firing Furnace

The temperature profile for the firing process was measured with a Datapaq DQ 1860 A datalogger from Datapaq Ltd., Cambridge, UK connected to a Wafer Test Assembly 1-T/C 156 mm SQ from Despatch (part no. DES-300038). The data logger is protected by a shielding box TB7250 from Datapaq Ltd., Cambridge, UK and connected to the thermocouple wires of the Wafer Test Assembly. The solar cell simulator was placed onto the belt of the firing furnace directly behind the last wafer so that the measured temperature profile of the firing process was measured accurately. The shielded data logger followed the Wafer Test assembly at a distance of about 50 cm to not affect the temperature profile stability. The data was recorded by data logger and subsequently analysed using a computer with Datapaq Insight Reflow Tracker V7.05 software from Datapaq Ltd., Cambridge, UK.

EXAMPLES

The invention is now explained by means of examples which are intended for illustration only and are not to be considered as limiting the scope of the invention.

Example 1

Paste Preparation

A paste was made by mixing, by means of a Kenwood Major Titanium mixer, the appropriate amounts of organic vehicle (Table 1), Ag powder (PV 4 from Ames Inc. with a $d_{50}$ of 2 µm), glass frit mixture according to table 2 ground to $d_{50}$ of 2 µm and an aluminium powder. The Al powder, obtained from Rusal, had a particle size of $d_{10}$ 1.5 µm, $d_{50}$ 2.5 µm, $d_{90}$ 4.5 µm and a spherical shape. The paste was passed through a 3-roll mill Exact 80 E with stainless steel rolls with a first gap of 120 µm and a second gap of 60 µm with progressively decreasing gaps to 20 µm for the first gap and 10 µm for the second gap several times until homogeneity. The viscosity was measured as mentioned above and appropriate amounts of organic vehicle with the composition given in Table 1 were added to adjust the paste viscosity toward a target in a range from about 16 to about 20 Pas. The wt. % s of the constituents of the paste are given in Table 3. The ZnO powder was obtained from Sigma Aldrich GmbH (article number 204951).

TABLE 1

Constitution of Organic Vehicle.

| Organic Vehicle Component | Proportion of component |
| --- | --- |
| 2-(2-butoxyethoxy)ethanol) [solvent] | 84 |
| ethyl cellulose (DOW Ethocel 4) [binder] | 6 |
| Thixcin ® E [thixotropic agent] | 10 |

TABLE 2

Glass Mixtures

| Glass Mixture # | Glass 1 | Glass f | $T_{gl}$ | $T_{gf}$ | $\Delta T_g$ | Glass 1:Glass f |
| --- | --- | --- | --- | --- | --- | --- |
| 1 (comparison) | Ceradyne Viox V1543 | Ceradyne Viox V1542 | 420° C. | 419° C. | 1° C. | 1:1 |
| 2 | Asahi Glass Co. ASF1290A4 | Asahi Glass Co. 7575BF | 332° C. | 320° C. | 12° C. | 1:1 |
| 3 | Asahi Glass Co. ASF1290A4 | Ceradyne Viox V1542 | 332° C. | 419° C. | 116° C. | 1:1 |

TABLE 3

Paste Examples

| Example # | Silver [wt. %] | Aluminium [wt. %] | Glass Mixture # | Glass Mixture [wt. %] | ZnO [wt. %] | Vehicle [wt. %] |
| --- | --- | --- | --- | --- | --- | --- |
| 1 | 84.5 | 0.75 | 1 | 4 | 0.5 | 10.25 |
| 2 | 84.5 | 0.75 | 2 | 4 | 0.5 | 10.25 |
| 3 | 84.5 | 0.75 | 3 | 4 | 0.5 | 10.25 |
| 4 | 85.25 | 0 | 3 | 4 | 0.5 | 10.25 |

Example 2

Solar Cell Preparation and Efficiency, Fill Factor and Series Resistance Measurement Pastes were applied to mono-crystalline Cz-n-type Silicon wafers with a boron doped front face and phosphorous doped back face. The wafers had dimensions of 156×156 mm² and a pseudo-square shape. The wafers had an anti-reflect/passivation layer of $SiN_x$ with a thickness of about 75 nm on both faces. The solar cells used were textured by alkaline etching. The example paste was screen-printed onto the p-doped face of the wafer using a semi-automatic screen printer X1 SL from Asys Group, EKRA Automatisierungs-systeme set with the following screen parameters: 290 mesh, 20 µm wire thickness, 18 µm emulsion over mesh, 72 fingers, 60 µm finger opening, 3 bus bars, 1.5 mm bus bar width. A commercially available Ag paste, SOL9600A, available from Heraeus Precious Metals GmbH & Co. KG, was printed on the back n-doped face of the device using the same printer and the following screen parameters: 325 mesh, 30 µm wire thickness, 18 µm emulsion over mesh, 156 fingers, 80 µm finger opening, 3 bus bars, 1.5 mm bus bar width. The device with the printed patterns was dried for 10 minutes at 150° C. in an oven after printing each side. The substrates were then fired with the p-doped side up in a Centrotherm DO-FF 8600-300 oven for 1.5 min. For each example, firing was carried out with maximum firing temperature of 800° C. The fully processed samples were then tested for IV performance using a HALM IV-Curve Tracker. Table 4 shows the resulting efficiency, fill factor, and series resistance, at the applied firing temperature.

TABLE 4 electrical properties of solar cells.

| Example | Cell Efficiency | Fill Factor | Series Resistance |
|---------|-----------------|-------------|-------------------|
| 1 | -- | -- | ++ |
| 2 | - | - | ++ |
| 3 | + | ++ | -- |
| 4 | -- | -- | ++ |

The series -- - + ++ represent an increasing series of values with -- lowest and ++ highest.

REFERENCE LIST

100 Solar cell
101 Doped Si wafer
102 p-n junction boundary
103 Front electrode
104 Back electrode
105 Front doped layer
106 Back doped layer
200 Solar cell
207 Front passivation layer
208 Back passivation layer
209 Anti-reflection layer
210 Highly doped back layer
300 Wafer
311 Additional layers on back face
312 Additional layers on front face
313 Electro-conductive paste
214 Front electrode fingers
215 Front electrode bus bars
400 Solar cell precursor
401 Wafer
402 Back face
403 Front face
404 p-doped layer
405 n-doped layer
406 Back Face
407 First area
408 First paste
409 Further area
410 Anti-reflection and/or passivation layer

The invention claimed is:

1. A solar cell precursor comprising as precursor parts
  i. a wafer with a back face and a front face, wherein the front face comprises a p-doped layer;
  ii. a first paste comprising
    Ag particles;
    Al particles in a range from about 0.01 to about 5 wt. %, based on the total weight of the paste;
    a vehicle;
    a glass frit in a range from about 0.1 to about 5 wt. %, based on the total weight of the paste, wherein the glass frit comprises a first glass frit with a glass transition temperature $T_{gl}$ and a further glass frit with a glass transition temperature $T_{gf}$, wherein both $T_{gl}$ and $T_{gf}$ are in a range from 320 to 500° C., and wherein $T_{gf}$ differs from $T_{gl}$ by at least 50° C.; and
    an additive, wherein the first paste is superimposed on a first area on said p-doped layer.

2. The solar cell precursor according to claim 1, wherein the first glass frit and the further glass frit are present in a weight ratio in a range from about 1:5 to about 5:1.

3. The solar cell precursor according to claim 1, wherein the first paste satisfies at least one of the following criteria:
  the viscosity of the first paste is in a range from about 5 to about 35 Pa·s;
  the vehicle comprises one or more solvents, and all solvents present in the paste have a boiling point in a range from about 90 to about 300° C.

4. The solar cell precursor according to claim 1, wherein the first paste satisfies at least one of the following criteria:
  the Al particles have a $d_{50}$, in a range from about 1 to about 5 µm;
  the Ag particles have a $d_{50}$ in a range from about 1 to about 4 µm; and
  the glass frit particles have a $d_{50}$, in a range from about 0.1 to about 3 µm.

5. The solar cell precursor according to claim 1, wherein the Ag particles are spherical.

6. The solar cell precursor according to claim 1, wherein the solar cell precursor further comprises a further paste superimposed on a further area on the back face.

7. The solar cell precursor according to claim 6, wherein the first area is smaller than the further area.

8. The solar cell precursor according to claim 6, wherein the further paste comprises
  Ag particles;
  a vehicle
  a glass frit; and
  an additive.

9. The solar cell precursor according to claim 1, wherein the thickness of the p-doped layer is in a range from about 10 nm to about 4 µm.

10. The solar cell precursor according to claim 1, wherein the back face comprises an n-doped layer, wherein the n-doped layer has a greater thickness than the p-doped layer.

11. The solar cell precursor according to claim 1, wherein the p-doped layer comprises B as a dopant.

12. The solar cell precursor according to claim 1, wherein the back face comprises an n-doped layer comprising P as a dopant.

13. The solar cell precursor according to claim 1, wherein one or more layers which act as anti-reflection layer and/or passivation layer are present between the p-doped layer and the superimposed first paste.

14. The solar cell precursor according to claim 13, wherein at least one of the layers which function as anti-reflection layer and/or passivation layer comprises $SiN_x$, wherein x stands for a positive but not necessarily whole number.

15. The solar cell precursor according to claim 1, wherein the first paste is superimposed on the first area in a grid pattern.

16. The solar cell precursor according to claim 15, wherein the grid pattern of the first paste superimposed on the first area comprises fingers with a width in a range from about 20 to about 100 µm and bus bars at an angle thereto in a range from about 70 to about 90° with a width in a range from about 0.5 to about 2.5 mm.

17. The solar cell precursor according to claim 1, wherein the solar cell precursor comprises a further paste superimposed on a further area on the back face in a grid.

18. The solar cell precursor according to claim 17, wherein the grid pattern of the further paste superimposed on the further area comprises fingers with a width in a range from about 20 to about 200 µm and bus bars at an angle thereto in a range from about 70 to about 90° with a width in a range from about 0.5 to about 2.5 mm.

19. The solar cell precursor according to claim 1, wherein both $T_{gl}$ and $T_{gf}$ are in a range from 320° C. to 420° C.

20. The solar cell precursor according to claim 1, wherein the $d_{50}$ of the Ag particles is in the range from about 1 μm to about 4 μm.

21. The solar cell precursor according to claim 1, wherein both $T_{gl}$ and $T_{gf}$ are in a range from 320° C. to 450° C.

22. A process for producing a solar cell comprising the steps
providing a solar cell precursor comprising as precursor parts;
i. a wafer with a back face and a front face, wherein the front face comprises a p-doped layer;
ii. a first paste comprising
Ag particles;
Al particles in a range from about 0.01 to about 5 wt. %, based on the total weight of the paste;
a vehicle;
a glass frit in a range from about 0.1 to about 5 wt. %, based on the total weight of the paste, wherein the glass frit comprises a first glass frit with a glass transition temperature $T_{gl}$ and a further glass frit with a glass transition temperature $T_{gf}$, wherein both $T_{gl}$ and $T_{gf}$ are in a range from 320 to 500° C., and wherein $T_{gf}$ differs from $T_{gl}$ by at least 50° C.; and
an additive, wherein the first paste is superimposed on a first area on said p-doped layer; and
firing the solar cell precursor in order to obtain the solar cell.

23. The process for producing a solar cell according to claim 22, wherein firing of said solar cell precursor satisfies at least one of the following criteria:
holding temperature in a range from about 700 to about 900° C.;
time at the holding temperature in a range from about 1 to about 10 s.

24. The process according to claim 22, wherein the first paste is applied to the front face through a screen.

25. The process according to claim 24, wherein the application through a screen satisfies at least one of the following parameters:
mesh count in a range from about 290 to about 400/inch;
wire thickness in a range from about 10 to about 30 μm;
emulsion over mesh (EoM) thickness in a range from about 5 to about 25 μm;
finger spacing in a range from about 1 to about 3 mm.

26. A solar cell obtainable from a process according to claim 22.

27. A module comprising at least one solar cell according to claim 26 and at least another solar cell.

28. A solar cell precursor comprising as precursor parts
i. a wafer with a back face and a front face, wherein the front face comprises a p-doped layer;
ii. a first paste comprising
Ag particles;
Al particles in a range from about 0.01 to about 5 wt. %, based on the total weight of the paste;
a vehicle;
a glass frit in a range from about 0.1 to about 5 wt. %, based on the total weight of the paste, wherein the glass frit comprises a first glass frit with a glass transition temperature $T_{gl}$ and a further glass frit with a glass transition temperature $T_{gf}$, wherein both $T_{gl}$ and $T_{gf}$ are in a range from 320 to 450° C., and wherein $T_{gf}$ differs from $T_{gl}$ by at least 10° C.; and
an additive, wherein the first paste is superimposed on a first area on said p-doped layer.

29. A solar cell precursor comprising as precursor parts
i. a wafer with a back face and a front face, wherein the front face comprises a p-doped layer;
ii. a first paste comprising
Ag particles;
Al particles in a range from about 0.01 to about 5 wt. %, based on the total weight of the paste;
a vehicle;
a glass frit in a range from about 0.1 to about 5 wt. %, based on the total weight of the paste, wherein the glass frit comprises a first glass frit with a glass transition temperature $T_{gl}$ and a further glass frit with a glass transition temperature $T_{gf}$, wherein both $T_{gl}$ and $T_{gf}$ are in a range from 320 to 450° C., and wherein $T_{gf}$ differs from $T_{gl}$ by at least 20° C.; and
an additive, wherein the first paste is superimposed on a first area on said p-doped layer.

* * * * *